United States Patent
Huang et al.

(10) Patent No.: US 9,660,587 B2
(45) Date of Patent: May 23, 2017

(54) POWER AMPLIFIER

(71) Applicant: WIN Semiconductors Corp., Tao Yuan (TW)

(72) Inventors: Fan-Hsiu Huang, New Taipei (TW); Jui-Chieh Chiu, Taoyuan (TW); Chih-Wen Huang, Taoyuan (TW)

(73) Assignee: WIN Semiconductors Corp., Tao Yuan (TW)

( * ) Notice: Subject to any disclaimer, the term of this patent is extended or adjusted under 35 U.S.C. 154(b) by 0 days.

(21) Appl. No.: 14/882,476

(22) Filed: Oct. 14, 2015

(65) Prior Publication Data
US 2016/0344346 A1 Nov. 24, 2016

(30) Foreign Application Priority Data
May 19, 2015 (TW) .............................. 104115866 A (51) Int. Cl.
| | |
|---|---|
| H03F 3/16 | (2006.01) |
| H03F 1/02 | (2006.01) |
| H03F 3/193 | (2006.01) |
| H03F 1/30 | (2006.01) |
| H03F 1/32 | (2006.01) |
| H03F 3/191 | (2006.01) |
| H03F 3/21 | (2006.01) |
| H03F 3/24 | (2006.01) |
| H03F 1/22 | (2006.01) |

(52) U.S. Cl.
CPC ........... *H03F 1/0205* (2013.01); *H03F 1/303* (2013.01); *H03F 1/32* (2013.01); *H03F 3/191* (2013.01); *H03F 3/193* (2013.01); *H03F 3/211* (2013.01); *H03F 3/245* (2013.01); *H03F 1/22* (2013.01); *H03F 1/223* (2013.01); *H03F 3/16* (2013.01); *H03F 2200/27* (2013.01); *H03F 2200/294* (2013.01); *H03F 2200/451* (2013.01)

(58) Field of Classification Search
CPC . H03F 1/0205; H03F 1/26; H03F 3/19; H03F 3/193; H03F 3/21
USPC .......................... 330/277, 285, 296, 300, 311
See application file for complete search history.

(56) References Cited

U.S. PATENT DOCUMENTS

| | | | |
|---|---|---|---|
| 5,398,004 A | 3/1995 | Kobayashi | |
| 5,838,031 A | 11/1998 | Kobayashi | |
| 6,642,794 B2 | 11/2003 | Mulder | |
| 6,768,377 B2 * | 7/2004 | Macedo | H03F 1/302 330/151 |
| 6,882,226 B2 * | 4/2005 | Cho | H03F 1/342 330/278 |
| 7,612,610 B2 | 11/2009 | Chen | |
| 7,619,482 B1 | 11/2009 | Kobayashi | |

(Continued)

*Primary Examiner* — Khanh V Nguyen
(74) *Attorney, Agent, or Firm* — Winston Hsu; Scott Margo (57) ABSTRACT

A power amplifier (PA) has been disclosed for linearity improvement. The PA comprises at least an amplifying transistor and at least an auxiliary transistor. Each amplifying transistor of the at least an amplifying transistor includes a first terminal for receiving an input signal of the PA, a second terminal for delivering an output signal of the PA, and a third terminal. Each auxiliary transistor of the at least an auxiliary transistor includes a first terminal, a second terminal coupled to the second terminal of the at least an amplifying transistor, and a third terminal electrically connected to the first terminal of the at least an amplifying transistor.

8 Claims, 7 Drawing Sheets

(56) References Cited

U.S. PATENT DOCUMENTS

| | | | | |
|---|---|---|---|---|
| 7,629,850 B2 * | 12/2009 | Floyd | ................. | G06F 17/5063 |
| | | | | 330/284 |
| 7,714,657 B2 * | 5/2010 | Wu | ....................... | H03F 1/0261 |
| | | | | 330/284 |
| 8,319,555 B1 * | 11/2012 | Heikkinen | .............. | H03F 1/565 |
| | | | | 330/283 |
| 8,648,656 B2 * | 2/2014 | Nozaki | ................ | H03F 1/0261 |
| | | | | 330/298 |
| 2007/0063767 A1 * | 3/2007 | Das | ......................... | H03F 1/14 |
| | | | | 330/51 |
| 2007/0216485 A1 | 9/2007 | Fujii | | |

* cited by examiner

POWER AMPLIFIER

BACKGROUND OF THE INVENTION

1. Field of the Invention

The present invention relates to a power amplifier, and more particularly, to a power amplifier with low circuit complexity, high stability against temperature and bias variations, and high signal linearity.

2. Description of the Prior Art

As technology evolves, wireless communication is an important part of human life. Various electronic devices, such as smart phones, smart wearable devices, tablets, etc., utilize wireless radio frequency (RF) system to transmit and receive wireless signals. A power amplifier (PA) is a necessary amplifier in a transmitter composing a wireless RF system. Small- and large-signal performances of the PA usually determine the performance of the overall wireless RF system. Moreover, signal linearity and stability against temperature and bias variations are key performance metrics of the PA.

In the prior art, PA circuits within using the techniques of harmonic signal detection and compensation, high-order harmonic adjustment, tunable output matching network, parallel type transconductance compensation, and envelope tracking are provided to improve the linearity thereof. The harmonic signal detection and compensation offers an adjustable function of automatic bias control by detecting and filtering an output signal through a feedback network when the output amplitude becomes a large signal. However, the circuit complexity thereof grows for practical implementation. In addition, using high-order harmonic adjustment and tunable output matching network controls a reflection condition of high-order harmonic waves and adjusts the waveform of an output signal by slightly tuning the harmonic impedances of an output impedance network in the PA circuit, such that the signal linearity of the PA circuit can be improved. Since a complicated output impedance network results in a worse performance such as an output power loss or the sensitivity to frequency response, more concerns are need to be considered in PA circuit design.

The parallel type transconductance compensation may adjust bias and generate a mixed output signal through two transistors combined in parallel, so as to achieve a compensation on third-order intermodulation (IMD3), which improves an overall linearity to the LNA circuits. Generally, high capacitance at both input and output ports presents in PA circuits for high output power consideration, which influences high frequency performance, i.e., high frequency impedance matching and high frequency signal gain. In addition, the envelope tracking architecture provides a dynamic bias control under different operating powers via feedback sensing network and digital controller, which improves the DC and RF power efficiencies. However, using envelope tracking requires more active and inactive components such as analog and digital control circuits, which could increase the circuit complexity and production cost of the PA circuit.

Therefore, how to provide a power amplifier with low circuit complexity, high stability in temperature and bias variations, and superior signal linearity is a significant objective in the field.

SUMMARY OF THE INVENTION

It is therefore a primary objective of the present invention to provide a power amplifier with low circuit complexity, high stability against temperature and bias variations, and high signal linearity.

The present invention discloses a power amplifier (PA). The PA comprises at least an amplifying transistor and at least an auxiliary transistor. Each amplifying transistor comprises a first terminal configured to receive an input signal of the PA, a second terminal configured to deliver an output signal of the PA, and a third terminal. Each auxiliary transistor comprises a first terminal, a second terminal coupled with the second terminal of the at least an amplifying transistor, and a third terminal electrically connected to the first terminal of the at least an amplifying transistor.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
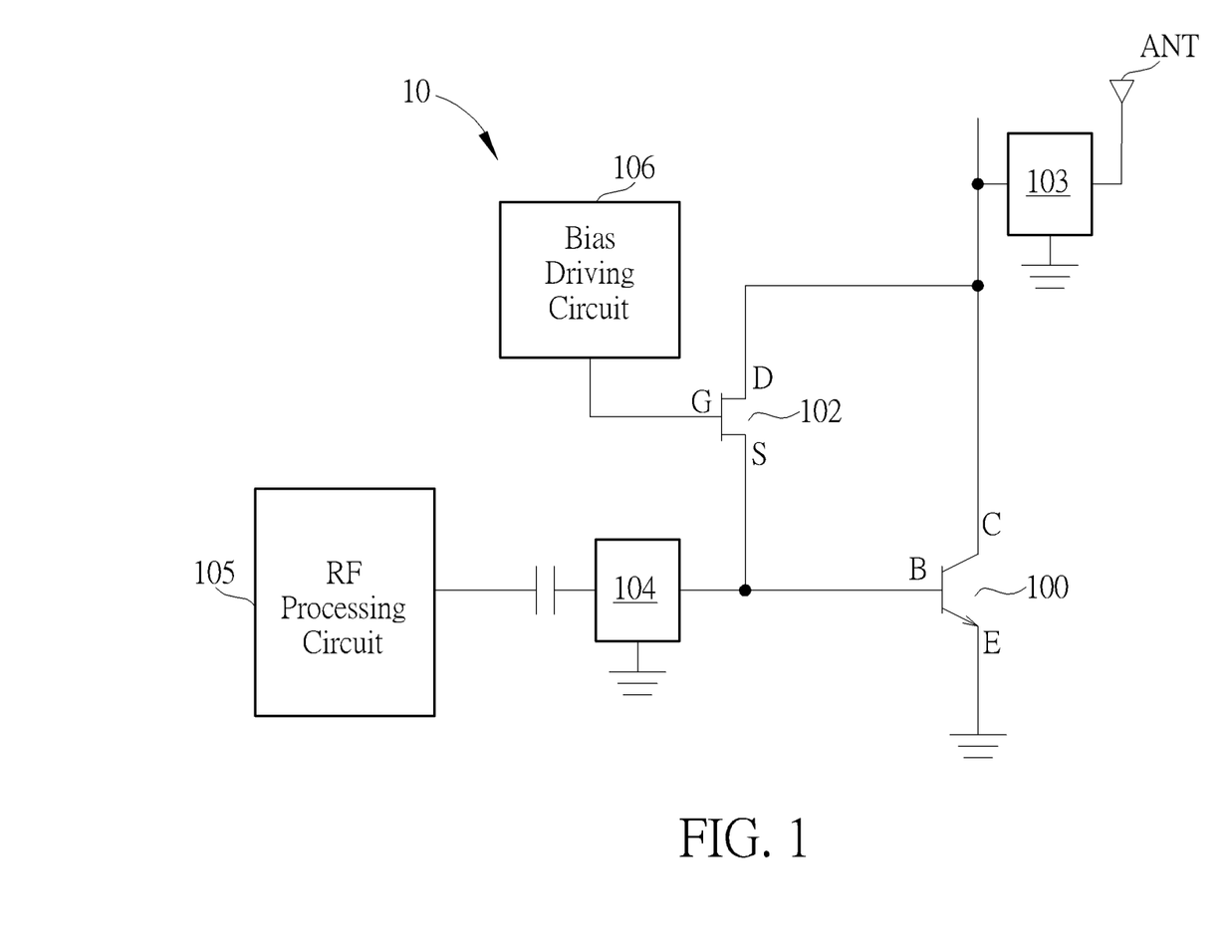
FIG. 1 is a schematic diagram of a power amplifier according to an embodiment of the present invention.

FIG. 1 is a schematic diagram of a power amplifier 10 according to an embodiment of the present invention. The power amplifier 10 is a single-stage power amplifier, which comprises an amplifying transistor 100 and an auxiliary transistor 102. The amplifying transistor 100 may be a bipolar junction transistor (BJT) or a heterojunction bipolar transistor (HBT). The auxiliary transistor 102 may be a metal-oxide-semiconductor field effect transistor (MOSFET) or a high electron mobility transistor (HEMT). The amplifying transistor 100 comprises a base B (first terminal), a collector C (second terminal) and an emitter E (third terminal). The base B may be coupled from a radio frequency processing circuit 105 through an input network 104. The input network 104 may comprise an impedance matching network, a gain amplifier, or a band pass filter. The base B is utilized to receive an input signal of the power amplifier 10. The collector C is coupled to an antenna ANT through an output network 103. The output network 103 may comprise an impedance matching network, a RF switch circuit, or a band pass filter (not illustrated in FIG. 1). The collector C is utilized to deliver an output signal of the power amplifier 10 to the antenna ANT. The emitter E may be connected to a system ground. The auxiliary transistor 102 comprises a gate G (first terminal), a drain D (second terminal) and a source S (third terminal). The drain D is coupled to the collector C of the amplifying transistor 100. The source S is electrically connected to the base B of the amplifying transistor 100. The gate G may be connected to a bias driving circuit 106, wherein the bias driving circuit 106 may be a fixed biasing circuit or a digital controllable and adjustable biasing circuit.

Note that, the auxiliary transistor 102 is combined between the input terminal (the base B) and the output terminal (the collector C) of the amplifying transistor 100. The bias condition of the power amplifier 10 may be adjusted by auxiliary transistor 102 to the input terminal of the amplifying transistor 100 according to an output amplitude level at the output terminal of the amplifying transistor 100. The signal linearity therefore is improved due to the bias adjustable function. Meanwhile, a temperature variation and a bias variation of the power amplifier 10 may be counteracted by a feedback mechanism provided by the auxiliary transistor 102, so as to cancel a self-heating effect and a bias shifting effect caused by the amplifying transistor 100 under a large signal operation and to stabilize the variation of the amplifying transistor 100 in high frequency, forming the stable power amplifier 10 which would not be significantly affected by the variations of temperature and bias. In other words, the power amplifier 10 only utilizes the single auxiliary transistor 102 to adjust the bias at the input terminal of the amplifying transistor 100 and counteract the temperature and bias variations of the amplifying transistor 100, so as to improve the signal linearity of the power amplifier 10. In addition, the power amplifier 10 can be achieved with low circuit complexity.

Figure 2:
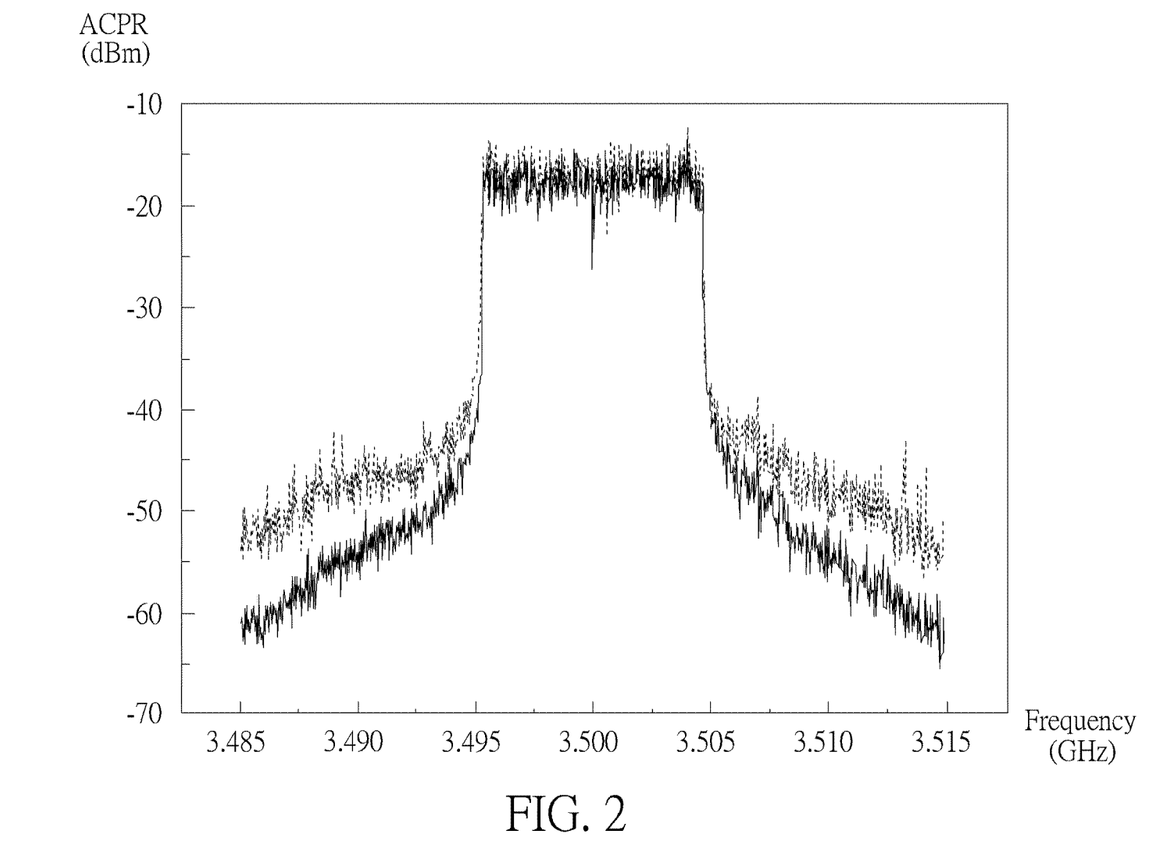
FIG. 2 is a signal spectrum diagram of adjacent channel power ratio (ACPR), generating by the power amplifiers with an auxiliary transistor and without the auxiliary transistor.
Figure 3:
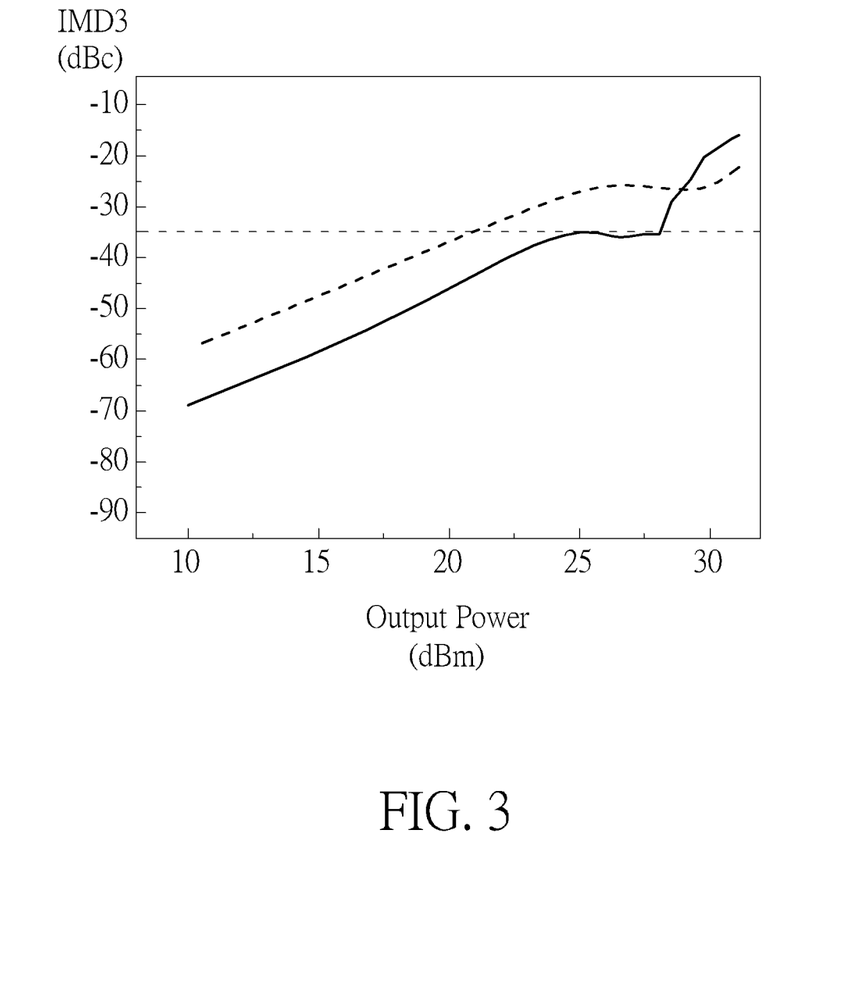
FIG. 3 is IMD3 performance comparison of the power amplifiers with an auxiliary transistor and without the auxiliary transistor.

FIGS. 2 and 3 are the comparisons of adjacent channel power ratio (ACPR) and linearity performance (i.e., third-order intermodulation (IMD3)) of power amplifiers with and without the auxiliary transistor, respectively, wherein the solid line represents the ACPR spectrum and the IMD3 performance of the power amplifier comprising the auxiliary transistor, and the dashed line represents the ACPR spectrum and the IMD3 performance of the power amplifier without the auxiliary transistor. As can be seen from FIGS. 2 and 3, the power amplifier comprising the auxiliary transistor may effectively suppress sideband transmitted power of and has a better linearity performance.

Figure 4:
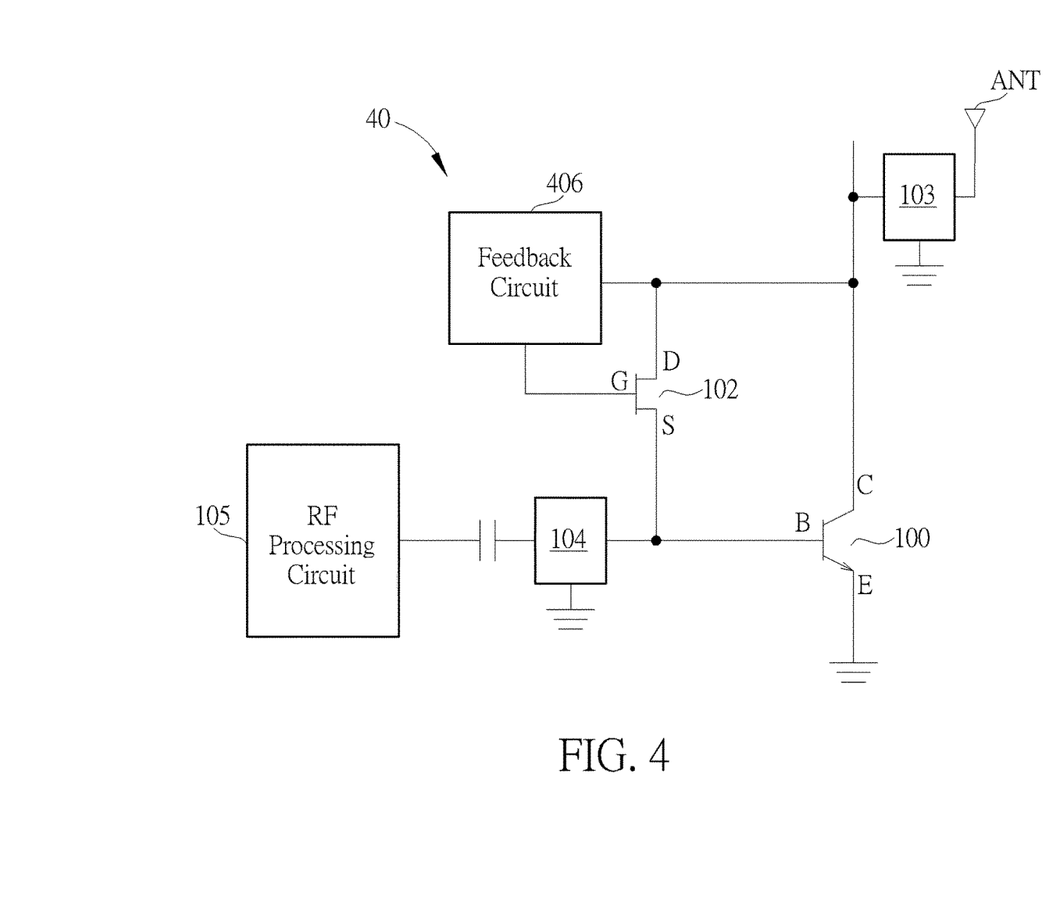
FIG. 4 is a schematic diagram of a power amplifier according to an embodiment of the present invention.

Notably, the embodiments stated in the above are utilized for illustrating concepts of the present invention. Those skilled in the art may make modifications and alternations accordingly, and not limited herein. For example, FIG. 4 is a schematic diagram of a power amplifier 40 according to an embodiment of the present invention. The power amplifier 40 is similar to the power amplifier 10, and thus, the same symbols are denoted by the same notations. Different from the power amplifier 10, the power amplifier 40 is combined with a feedback circuit 406, the feedback circuit 406 is coupled between the gate and the drain of the auxiliary transistor 102, which satisfies the requirements of the present invention, and not limited herein. In addition, the amplifying transistor is not limited to be a BJT or an HBT. The amplifying transistor may also be a field effect transistor (FET) such as a MOSFET or an HEMT. In such a situation, the first terminal of the amplifying transistor is a gate of the FET, and the second terminal and the third terminal of the amplifying transistor are a drain or a source of the FET. In addition, the auxiliary transistor is not limited to be a MOSFET or a HEMT. The auxiliary transistor may also be a BJT or an HBT. In such a situation, the first terminal of the auxiliary transistor is a base of the BJT/HEMT, and the second terminal and the third terminal of the auxiliary transistor are a collector and an emitter of the BJT/HEMT.

Figure 5:
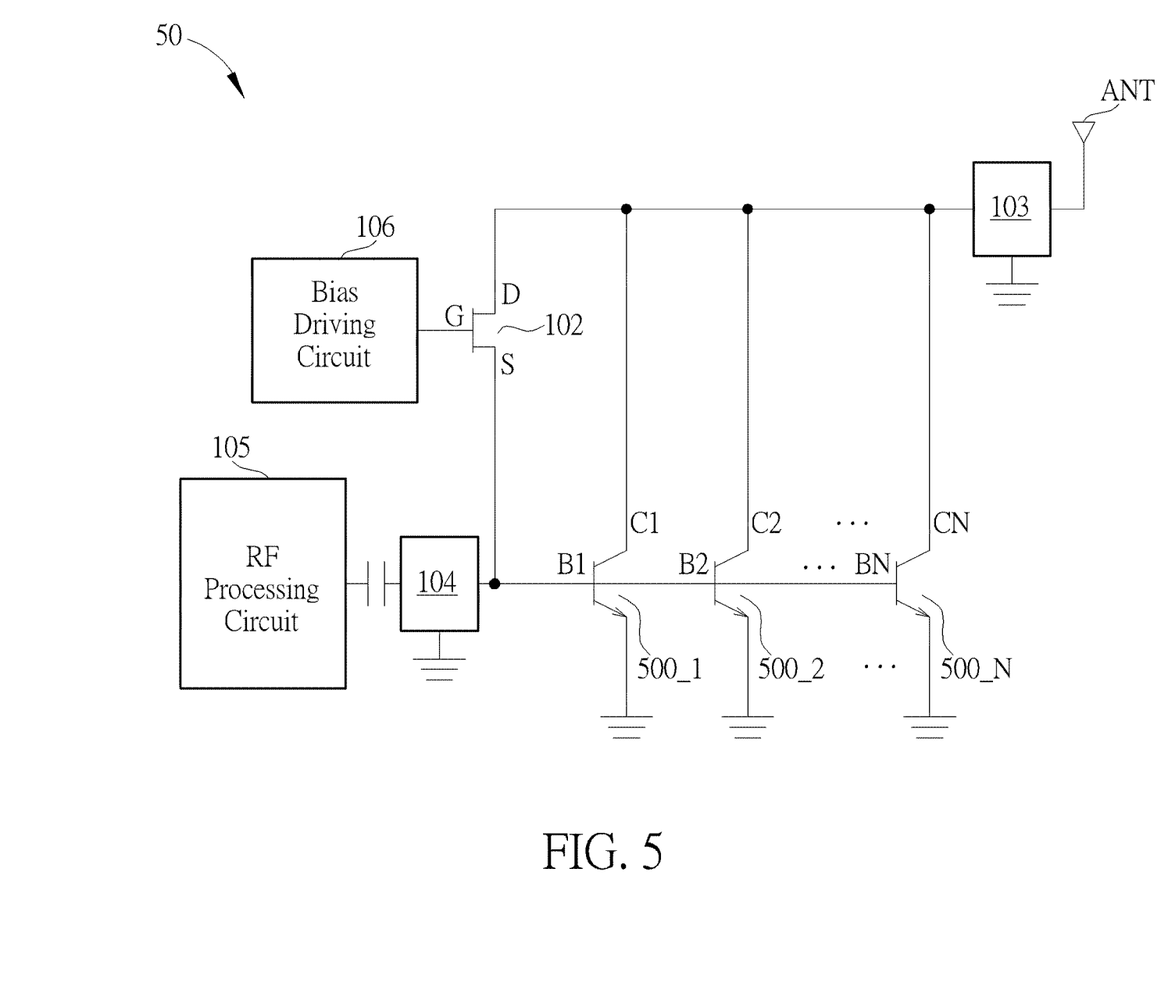
FIG. 5 is a schematic diagram of a power amplifier according to an embodiment of the present invention.
Figure 6:
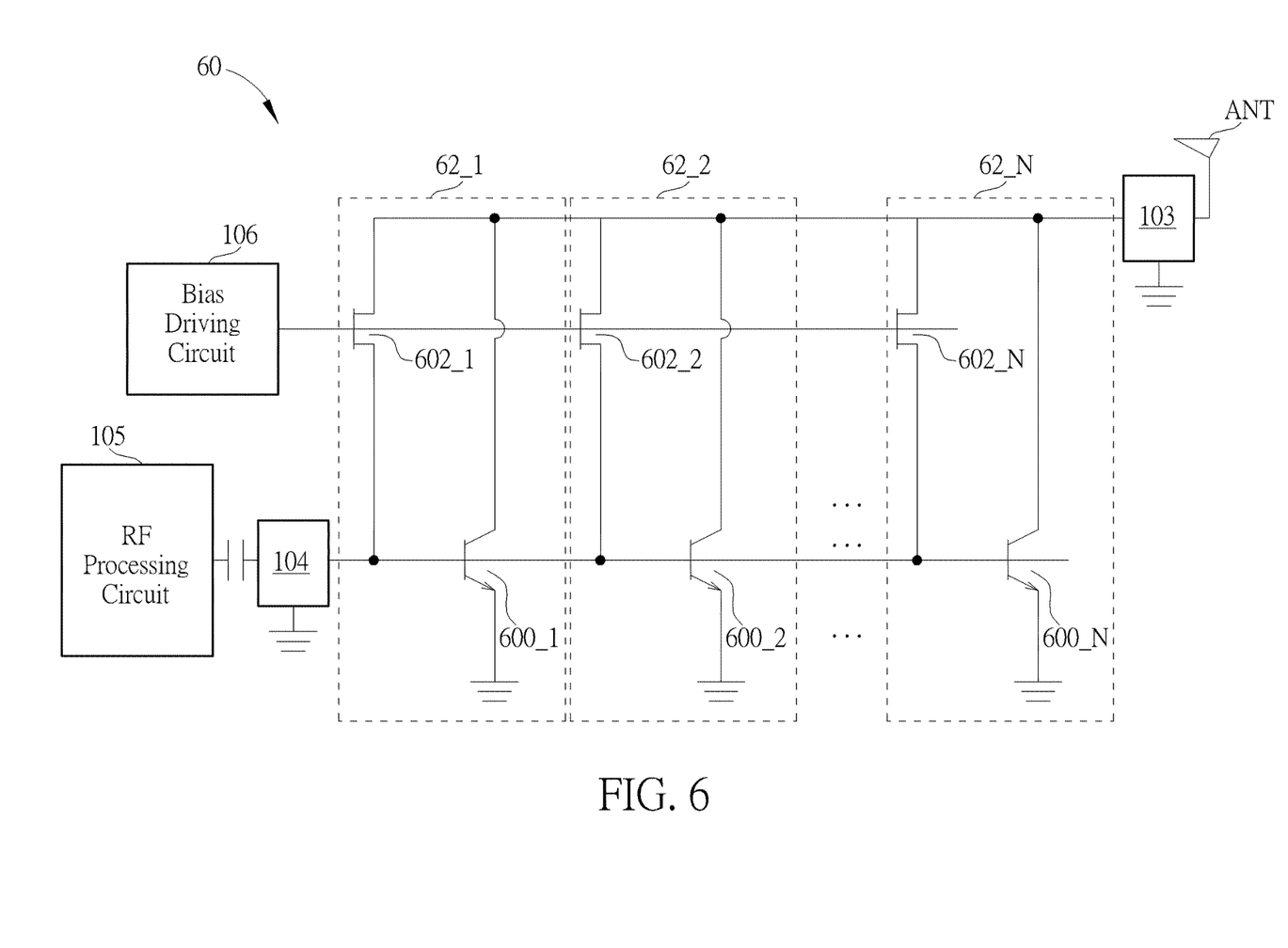
FIG. 6 is a schematic diagram of a power amplifier according to an embodiment of the present invention.
Figure 7:
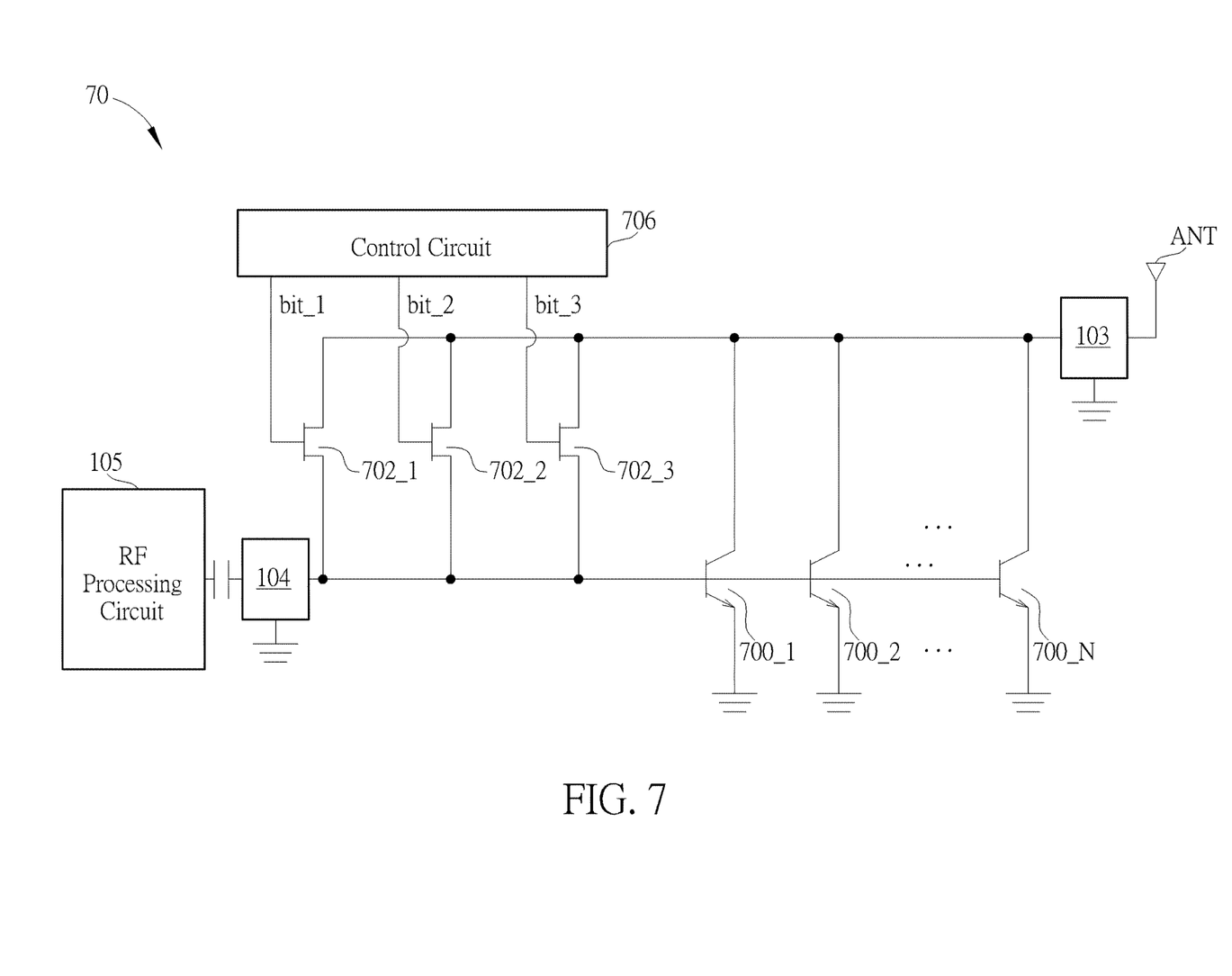
FIG. 7 is a schematic diagram of a power amplifier according to an embodiment of the present invention.

In addition, the power amplifier of the present invention is not limited to comprise only one amplifying transistor. The power amplifier may comprise a plurality of amplifying transistors. For example, FIG. 5 is a schematic diagram of a power amplifier 50 according to an embodiment of the present invention. The power amplifier 50 is similar to the power amplifier 10, and thus, the same symbols are denoted by the same notations. Different from the power amplifier 10, the power amplifier 50 comprises a plurality of amplifying transistors 500_1-500_N. The drain D of the auxiliary transistor 102 is coupled to collectors C_1-C_N of the amplifying transistors 500_1-500_N, and the source S is electrically connected to bases B_1-B_N of the amplifying transistors 500_1-500_N, which also meet requirements of the present invention. In addition, the power amplifier of the present invention may be an integrated-stage power amplifier by connecting multiple single-stage power amplifiers. For example, FIG. 6 is a schematic diagram of a power amplifier 60 according to an embodiment of the present invention. The power amplifier 60 is an integrated-stage power amplifier, comprising a plurality of single-stage power amplifiers 62_1-62_N connected in parallel. Each single-stage power amplifier 62_x is the same as the power amplifier 10, i.e., each single-stage power amplifier 62_x comprises an amplifying transistor 600_x and an auxiliary transistor 602_x. A drain of the auxiliary transistor 602_x is coupled to a collector of the amplifying transistor 600_x, and a source of the auxiliary transistor 602_x is electrically connected to a base of the amplifying transistor 600_x. Note that, in the power amplifier 60, a number of the auxiliary transistors 602_1-602_N is the same as a number of the amplifying transistors 600_1-600_N, and gates of the auxiliary transistors 602_1-602_N are combined together. Nevertheless, it is not limited thereto. For example, FIG. 7 is a schematic diagram of a power amplifier 70 according to an embodiment of the present invention. The power amplifier 70 comprises amplifying transistors 700_1-700_N and auxiliary 702_1-702_3. Gates of the auxiliary transistors 702_1-702_3 respectively receive bit-controlled signals bit_1-bit_3 generated by a control circuit 706 to control on-off statuses of the auxiliary transistors 702_1-702_3. As long as drains of the auxiliary transistors 702_1-702_3 are coupled to collectors of the amplifying transistors 700_1-700_N, and sources of the auxiliary transistors 702_1-702_3 are electrically connected to bases of the amplifying transistors 700_1-700_N, requirements of the present invention are satisfied.

In summary, the power amplifier of the present invention only utilizes the single auxiliary transistor to adjust the bias at the input terminal of the amplifying transistor and counteract the temperature characteristic and bias variation of the amplifying transistor, so as to improve the signal linearity and the stabilities of temperature and bias. In addition, the power amplifier of the present invention has low circuit complexity.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:
1. A power amplifier (PA), comprising:
   at least an amplifying transistor being a bipolar junction transistor (BJT), each amplifying transistor comprising:
      a first terminal being a base of the BJT, configured to receive an input signal of the PA;
      a second terminal, configured to output an output signal of the PA; and
      a third terminal; and at least an auxiliary transistor being a field effect transistor (FET), each auxiliary transistor comprising:
a first terminal being a gate of the FET;
a second terminal, coupled to the second terminal of the at least an amplifying transistor; and
a third terminal, electrically connected to the first terminal of the at least an amplifying transistor;
wherein the first terminal of the at least an auxiliary transistor is coupled to a terminal of a feedback circuit, and another terminal of the feedback circuit is coupled to the second terminal of the at least an amplifying transistor.

2. The PA of claim 1, wherein the first terminal of the at least an amplifying transistor is coupled to a radio frequency processing circuit for receiving the input signal of the PA, and the second terminal of the at least an amplifying transistor is coupled to an antenna for delivering the output signal to the antenna.

3. The PA of claim 1, wherein the third terminal of the at least an amplifying transistor is coupled to a system ground.

4. The PA of claim 1, wherein the first terminal of the at least an auxiliary transistor is coupled to a driving circuit.

5. The PA of claim 1, wherein the second terminal and the third terminal of the at least an amplifying transistor are a collector and an emitter of the BJT.

6. The PA of claim 5, wherein the at least an amplifying transistor is a heterojunction bipolar transistor (HBT).

7. The PA of claim 1, wherein the second terminal and the third terminal of the at least an auxiliary transistor are a drain or a source of the FET.

8. The PA of claim 7, wherein the at least an auxiliary transistor is a high electron mobility transistor.

* * * * *